US 6,574,082 B2

(12) United States Patent
Vitek

(10) Patent No.: US 6,574,082 B2
(45) Date of Patent: Jun. 3, 2003

(54) METHODS AND SYSTEMS FOR OPERATING TEMPERATURE CONTROLS FOR ELECTRONIC EQUIPMENT

(75) Inventor: Edward Vitek, Raleigh, NC (US)

(73) Assignee: Ericsson Inc., Research Triangle Park, NC (US)

(*) Notice: Subject to any disclaimer, the term of this patent is extended or adjusted under 35 U.S.C. 154(b) by 95 days.

(21) Appl. No.: 09/973,437

(22) Filed: Oct. 9, 2001

(65) Prior Publication Data

US 2003/0067722 A1 Apr. 10, 2003

(51) Int. Cl.[7] ............................ H02H 3/18; H02H 3/26; H02H 3/42
(52) U.S. Cl. ........................... 361/78; 361/103; 361/695
(58) Field of Search .......................... 361/78, 103, 92, 361/695; 256/47

(56) References Cited

U.S. PATENT DOCUMENTS

| | | | | |
|---|---|---|---|---|
| 4,977,351 A | * | 12/1990 | Bavaro et al. | 315/87 |
| 6,017,188 A | * | 1/2000 | Benton | 416/5 |
| 6,104,611 A | * | 8/2000 | Glover et al. | 361/700 |
| 6,311,046 B1 | * | 10/2001 | Dent | 455/91 |
| 6,505,774 B1 | * | 1/2003 | Fulcher et al. | 235/381 |

* cited by examiner

Primary Examiner—Brian Sircus
Assistant Examiner—Zeev Kitov
(74) Attorney, Agent, or Firm—Myers Bigel Sibley & Sajovec

(57) ABSTRACT

Electronic equipment can be operated in an enclosure wherein the electronic equipment is powered by a DC power source including a rectifier that receives an AC power signal and a battery that provides backup when the AC power signal is interrupted. For example, a DC power signal generated by the DC power source and a temperature in the enclosure for the electronic equipment can be monitored. The DC power signal can be blocked from the electronic equipment in the enclosure when the DC power signal is less than a low voltage threshold for the battery or when the temperature in the enclosure is outside a range of first high and low temperature thresholds for operation of the electronic equipment. The DC power signal can be provided to the electronic equipment in the enclosure when the DC power signal is above the low voltage threshold for the battery and when the temperature in the enclosure is within the range of the first high and low temperature thresholds for operation of the electronic equipment. A temperature control fan can be operated when the DC power signal is above the low voltage threshold and the temperature is outside a range of second high and low temperature thresholds for operation of the fan. Operation of the temperature control fan can be blocked when the DC power signal is less than the low voltage threshold for the battery or when the temperature is within the range of the second high and low temperature thresholds for operation of the fan.

22 Claims, 8 Drawing Sheets

| EXAMPLE # | OPERATING VARIABLE | | | | |
|---|---|---|---|---|---|
| | 1 | 2 | 3 | 4 | 5 |
| | AC POWER PRESENT | ENCLOSURE TEMP WITHIN FIRST HIGH AND LOW TEMPERATURE THRESHOLDS | NODE A AT OR ABOVE LOW VOLTAGE THRESHOLD | DISCONNECT RELAY CLOSED | FAN POWER PRESENT |
| 1. | YES | YES | YES | YES | YES |
| 2. | NO | YES | NO | NO | NO |
| 3. | YES | NO | YES | NO | YES |
| 4. | NO | NO | NO | NO | NO |
| 5. | NO | NO | YES | NO | NO |
| 6. | NO | YES | YES | YES | YES |

FIG. 2.

METHODS AND SYSTEMS FOR OPERATING TEMPERATURE CONTROLS FOR ELECTRONIC EQUIPMENT

BACKGROUND OF THE INVENTION

The present invention relates to temperature control methods and systems for electronic equipment.

Electronic devices are often housed in an enclosure such as a cabinet to provide protection from an outside environment and to provide an acceptable temperature range for operation of the electronic equipment within the enclosure. For example, electronic equipment at a radio base station for a radiotelephone system operator may be housed in an enclosure to provide protection from the weather. Moreover, a temperature control system may be provided in such an enclosure to cool electronic equipment therein when it gets too warm, and/or to heat the electronic equipment when it gets too cold. In particular, the temperature control system may include a fan to blow cool or warm air as required.

SUMMARY OF THE INVENTION

According to aspects of the present invention, electronic equipment can be operated in an enclosure wherein the electronic equipment is powered by a DC power source including a rectifier that receives an AC power signal and a battery that provides backup when the AC power signal is interrupted. For example, a DC power signal generated by the DC power source and a temperature in the enclosure for the electronic equipment can be monitored. The DC power signal can be blocked from the electronic equipment in the enclosure when the DC power signal is less than a low voltage threshold for the battery or when the temperature in the enclosure is outside a range of first high and low temperature thresholds for operation of the electronic equipment. The DC power signal can be provided to the electronic equipment in the enclosure when the DC power signal is above the low voltage threshold for the battery and when the temperature in the enclosure is within the range of the first high and low temperature thresholds for operation of the electronic equipment. A temperature control fan can be operated when the DC power signal is above the low voltage threshold and the temperature is outside a range of second high and low temperature thresholds for operation of the fan. Operation of the temperature control fan can be blocked when the DC power signal is less than the low voltage threshold for the battery or when the temperature is within the range of the second high and low temperature thresholds for operation of the fan.

BRIEF DESCRIPTION OF THE DRAWINGS

FIG. 2 is a table illustrating operations of systems and method according to embodiments of the present invention.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1A:
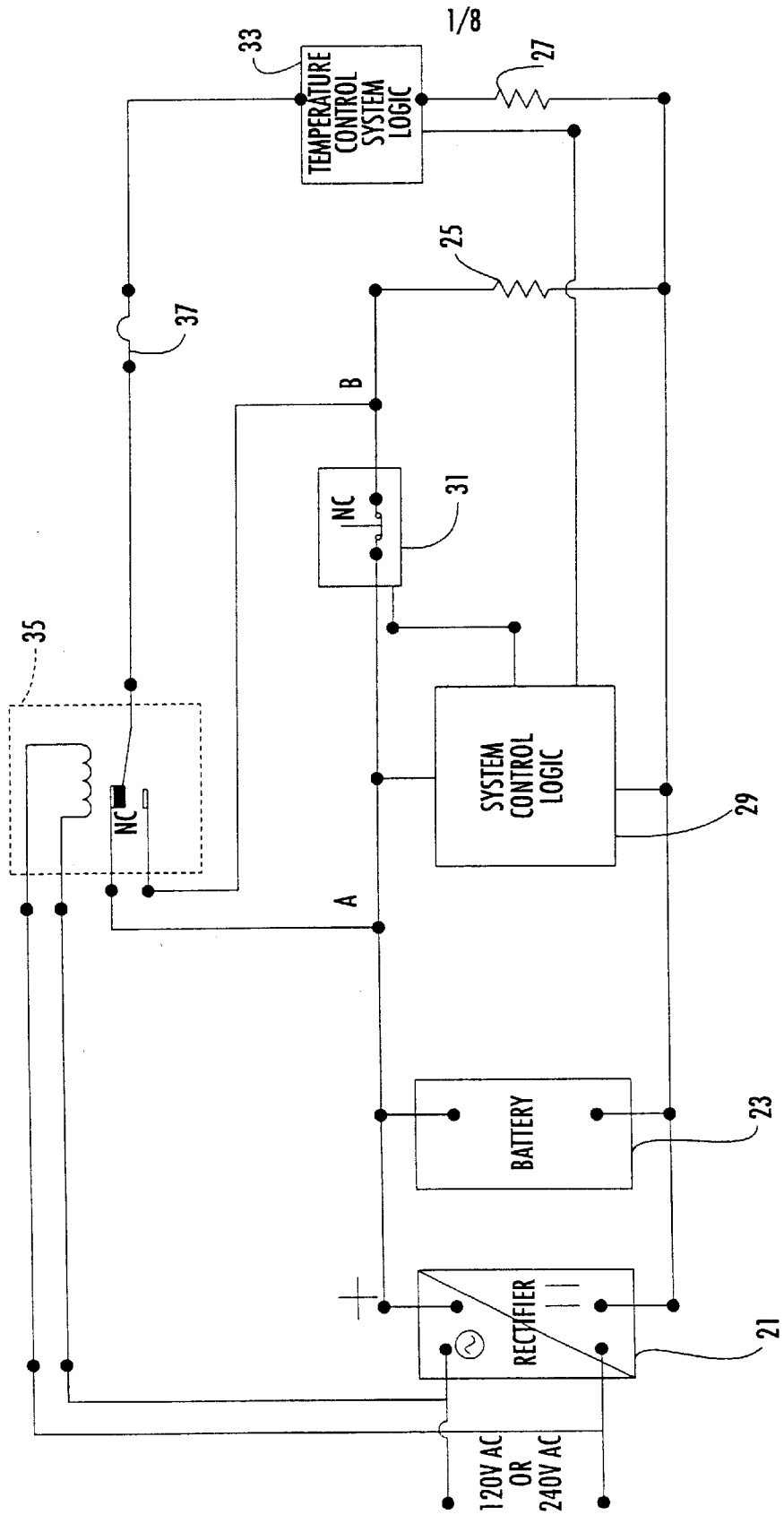
FIG. 1A is a first schematic diagram of systems and methods according to embodiments of the present invention.

A schematic diagram for an electrical system housed in an enclosure is illustrated in FIG. 1A. This system may include a rectifier 21 that converts an AC power signal (such as a 120V AC or a 240V AC signal) to a DC power signal, and a battery 23 that can provide a DC power signal back-up in the event that the AC power signal is interrupted. The rectifier 21 and/or the battery 23 can be used to power the electronic equipment 25 that is modeled as a DC resistive load in FIG. 1A. The electronic equipment 25 can be the radio base station equipment housed in an enclosure at a radio base station of a radiotelephone system operator. Alternatively, the electronic equipment 25 could be electronic equipment for any other electronic device or system.

The system of FIG. 1A can also include temperature control fan(s) 27 (modeled as a second DC resistive load) used to heat and/or cool the electronic equipment 25. If the temperature of the electronic equipment 25 or the temperature within the enclosure enclosing the electronic equipment exceeds a high temperature threshold, the fan(s) can blow air through the enclosure and/or across the electronic equipment 25 to cool the electronic equipment. If the temperature of the electronic equipment 25 and/or the temperature within the enclosure enclosing the electronic equipment falls below a low temperature threshold, the fan(s) can blow heated air through the enclosure and/or across the electronic equipment 25 to heat the electronic equipment 25.

System control logic 29 can monitor the system environment including the temperature in the enclosure and/or the temperature of the electronic equipment 25 to control a disconnect switch, such as disconnect relay 31, and the temperature control system logic 33. In particular, the disconnect relay 31 can be maintained in the closed position as long as the temperature in the enclosure and/or the temperature of the electronic equipment 25 is within an acceptable range for operation of the electronic equipment 25 between first low and high temperature thresholds for operation of the electronic equipment and as long as the voltage at the node A (the voltage generated by the rectifier 21 and/or the battery 23) is above a prescribed low voltage threshold. If the temperature of the enclosure and/or the temperature of the electronic equipment is outside the first low and high temperature thresholds for operation of the electronic equipment or the voltage at node A is below the low voltage threshold, the disconnect relay 31 can be opened to protect the electronic equipment 25. For example, the system control logic 29 may provide a first low temperature threshold such as 14° F., a first high temperature threshold such as 131° F., and a low voltage threshold such as 21V such that the disconnect relay is opened if the temperature falls below the first low temperature threshold, if the temperature rises above the first high temperature threshold, or the voltage at node A falls below the low voltage threshold to thereby protect the electronic equipment 25.

The system control logic 29 can further provide temperature and/or control information to the temperature control system logic 33 which can use the information to control the fan(s) 27 and any other components of a temperature control system. For example, the fan(s) can blow ambient or air conditioned air to cool the enclosure and electronic equipment 25, or the fan(s) can blow heated air to heat the enclosure and electronic equipment 25. The temperature control system logic 33 can turn the fan(s) on to blow heated air and to heat the enclosure and electronic equipment when the temperature is below a second low temperature threshold for operation of the fan(s) (greater than the first low temperature threshold) to maintain a temperature above the first low temperature threshold. The temperature control system logic 33 can also turn the fan(s) on to blow ambient or air conditioned air and to cool the enclosure and electronic equipment 25 when the temperature is above a second high temperature threshold for operation of the fan(s) (less than the first high temperature threshold) to maintain a temperature less than the first high temperature threshold. Accordingly, the temperature control system logic 33 can operate the fan(s) 27 as long as power is provided via AC relay 35. While the temperature control system logic 33 has been discussed above as receiving temperature information from the system control logic 29, temperature information could be provided independently at the temperature control system logic 33, or temperature information could be provided from the temperature control system logic 33 to the system control logic 29. According to yet another alternative, functionality of the system control logic 29 and the temperature control system logic 33 can be combined in a single logic block that controls the disconnect relay 31 and a relay or switch coupled between a switch such as AC relay 35 and the fan(s) 27.

Figure 1B:
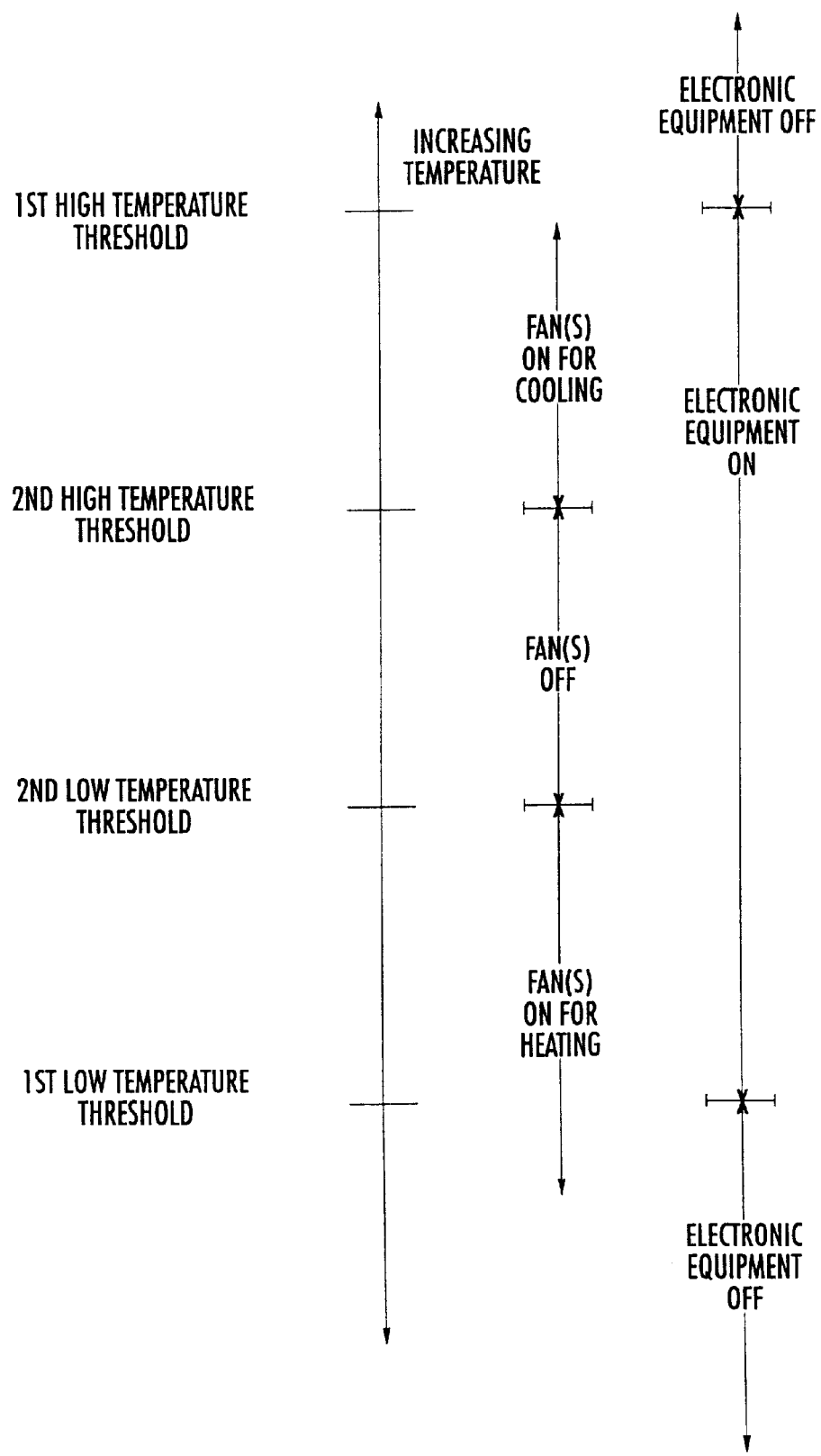
FIG. 1B is a diagram illustrating temperature thresholds for operation of fan(s) and electronic equipment according to embodiments of the present invention.

FIG. 1B illustrates the first high and low temperature thresholds for operation of the electronic equipment and the second high and low temperature thresholds for operation of the fan(s) according to embodiments of the present invention. In FIG. 1B, the temperatures increase from the bottom of the Figure to the top of the Figure and decrease from the top of the Figure to the bottom of the Figure As shown, the first high and low temperature thresholds are used for operation of the electronic equipment, and the second high and low temperature thresholds are used for operation of the fan(s). As shown, the electronic equipment 25 can be turned off if the temperature within the enclosure and/or the temperature of the electronic equipment is outside the range defined by the first high and low temperature thresholds for operation of the electronic equipment. The electronic equipment 25 can be turned on if the temperature within the enclosure and/or the temperature of the electronic equipment is within the range defined by the first high and low temperature thresholds for operation of the electronic equipment and the voltage at node A is above the low battery threshold for the battery 23. The fan(s) can be turned on for cooling when the temperature within the enclosure and/or the temperature of the electronic equipment rises above the second high temperature threshold (less than the first high temperature threshold) as long as the voltage at node A exceeds the low voltage threshold for the battery. The fan(s) can be turned on for heating when the temperature within the enclosure and/or the temperature of the electronic equipment falls below the second low temperature threshold (greater than the first low temperature threshold) as long as the voltage at node A exceeds the low voltage threshold for the battery.

As will be understood, a common temperature sensor can be used to measure the temperature within the enclosure and/or the electronic equipment, and the output of the common sensor can be used to determine whether the temperature is within or outside the temperature ranges defined by the first and second high and low temperature thresholds. Alternately, a first sensor(s) can be used to determine whether the temperature is within or outside the range defined by the first high and low temperature thresholds, and a second sensor(s) can be used to determine whether the temperature is within or outside the range defined by the second high and low temperature thresholds. Moreover, the sensor(s) can be considered as part of the system control logic and/or the temperature control system logic of FIG. 1A.

The temperature thresholds discussed above can also provide margins for hysteresis so that the fan(s) and/or electronic equipment is not turned on and off excessively. The second high temperature threshold, for example, can be defined such that the fan(s) turn on for cooling when the temperature rises above a first temperature, and the fan(s) are turned off only after the temperature falls below a second temperature less than the first temperature. Similarly, the second low temperature threshold can be defined such that the fan(s) turn on for heating when the temperature falls below a third temperature, and the fan(s) are turned off only after the temperature rises above a fourth temperature greater than the third temperature. The first high and low temperature thresholds can similarly be defined to include margins for hysteresis.

The AC relay 35 (for example having 25 A DC Contacts) of FIG. 1A can alternately provide coupling between temperature control system logic 33 and node A when AC power is provided to the rectifier 21, and can provide coupling between temperature control system logic 33 and node B when AC power is not being provided to the rectifier 21. When AC power is provided to the rectifier 21, the temperature control system logic 33 and the fan(s) 27 can thus receive power whether the disconnect relay 31 is opened or closed. Accordingly, the fan(s) 27 may operate to control the temperature even when the electronic equipment 25 is turned off at disconnect relay 31 as long as AC power is being provided to the rectifier 21.

In the event that there is an interruption of AC power, the AC relay 35 can couple the temperature control system logic 33 and fan(s) 27 to the node B so that power to the temperature control system logic 33 and fan(s) 27 will be disconnected if the disconnect relay 31 is opened. Accordingly, power to the temperature control system logic 33 and fan(s) 27 will be disconnected when the battery voltage drops below the low voltage threshold. Accordingly, the fan(s) will not run the battery 23 down to an excessively discharged state in the event that AC power is interrupted for a prolonged period of time and the temperature is above the second high temperature threshold or below the second low temperature threshold. The system of FIG. 1A can also include fuse 37 coupled in series between temperature control system logic 33 and AC relay 35.

FIG. 2 is a table illustrating logic for operating fan power in systems according to embodiments of the present invention. As shown in example 1, if AC power is provided to the rectifier 21, the temperature within the enclosure is within the first high and low temperature thresholds, and node A is above the low voltage threshold, the disconnect relay 31 will be closed and fan power will be available from node A through AC relay 35. Accordingly, the electronic equipment will be powered from node B and power will be available from node A for the fan(s) to operate under control of the temperature control system logic.

In example 2, if AC power is not provided to the rectifier 21 so that the temperature control system logic 33 is coupled to node B through AC relay 35, the enclosure temperature is within the first high and low temperature thresholds, and node A is below the low voltage threshold, the disconnect relay 31 will be open and fan power will not be present. Accordingly, the electronic equipment 25 will not be powered, and power will not be available for operation of the fan(s). In example 3, if AC power is provided to the rectifier 21, the enclosure temperature is outside the range of the first high and low temperature thresholds, and node A is above the low voltage threshold, the disconnect relay 31 will not be closed and fan power will be available from node A through AC relay 35. Accordingly, the electronic equipment will not be powered, but fan power will be available from node A so that the enclosure can be heated or cooled as appropriate.

In example 4, if AC power is not provided to the rectifier 21 so that the temperature control system logic 33 is coupled to node B through AC relay 35, the enclosure temperature is not within the range of the first high and low temperature thresholds, and node A is below the low voltage threshold, the disconnect relay will be open, and fan power will not be available. Accordingly, the electronic equipment will not be powered, and power will not be available for operation of the fan(s) 27.

In example 5, if AC power is not provided to the rectifier 21 so that the temperature control system logic 33 is coupled to node B through AC relay 35, the enclosure temperature is not within the range of the first high and low temperature thresholds, and node A is above the low voltage threshold, the disconnect relay 31 will be open and the fan power will not be available from node B. Accordingly, the electronic equipment will not be powered, and power will not be available for operation of the fan(s) 27. As shown in examples 2 and 4, fan power will not be available when AC power is not available and the battery voltage drops below the low battery threshold. The fan(s) 27 can thus be operated during interruptions of AC power while protecting the battery 23 from over discharge. As shown in example 5, fan power will not be available when AC power is not available and the enclosure temperature is outside the range of the first high and low temperature thresholds, even if the voltage at node A is above the low voltage threshold.

In example 6, if AC power is not provided to the rectifier 21 so that the temperature control system logic 33 is coupled to node B through AC relay 35, the enclosure temperature is within the range of the first high and low temperature thresholds for operation of the electronic equipment, and node A is at or above the low voltage threshold, the disconnect relay 31 will be closed and the fan power will be available from node B. In example 6, the voltage at node A will be above the low voltage threshold as long as AC power is provided through the rectifier.

Figure 3:
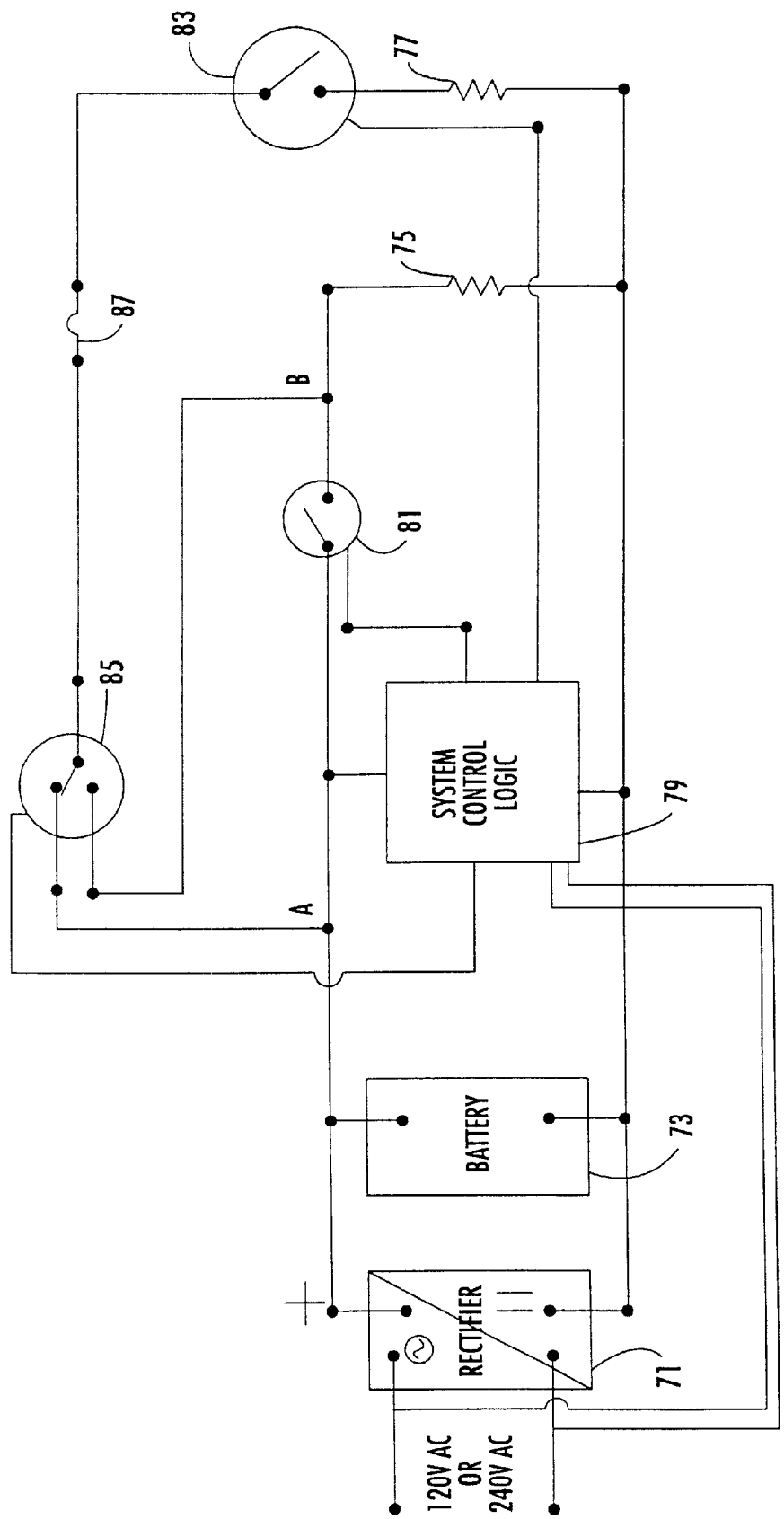
FIG. 3 is a second schematic diagram of systems and methods according to embodiments of the present invention.

FIG. 3 is a schematic diagram for a second electrical system housed in an enclosure according to embodiments of the present invention. This system is similar to the system of FIG. 1A with differences being that AC switch 85 and disconnect switch 81 respectively replace AC relay 35 and disconnect relay 31 of FIG. 1A; that the functionalities of system control logic 29 and temperature control system logic 33 of FIG. 1A are consolidated into system control logic 79; and that the fan control switch 83 has been added. Moreover, the AC power signal is provided to the system control logic 79 that controls the switch 85. In FIG. 3, each of the AC switch 85, the disconnect switch 81, and the fan control switch 83 can be solid state switches, relays, or other known switches operating under control of the system control logic 79. The system of FIG. 3 can operate according to the examples of FIG. 2 to provide the same results as systems of FIG. 1.

The system of FIG. 3 may include a rectifier 71 that converts an AC power signal (such as a 120V AC or a 240V AC signal) to a DC power signal, and a battery 73 that can provide a DC power signal back-up in the event that the AC power signal is interrupted. The rectifier 71 and/or the battery 73 can be used to power the electronic equipment 75 that is modeled as a DC resistive load in FIG. 3. The electronic equipment 75 can be the radio base station equipment housed in an enclosure at a radio base station of a radiotelephone system operator. Alternatively, the electronic equipment 75 could be electronic equipment for any other electronic device or system.

The system of FIG. 3 can also include temperature control fan(s) 77 (modeled as a second DC resistive load) used to heat and/or cool the electronic equipment 75. If the temperature of the electronic equipment 75 or the temperature within the enclosure enclosing the electronic equipment exceeds a high temperature threshold, the fan(s) can blow air through the enclosure and/or across the electronic equipment 75 to cool the electronic equipment. If the temperature of the electronic equipment 75 and/or the temperature within the enclosure enclosing the electronic equipment falls below a low temperature threshold, the fan(s) can blow heated air through the enclosure and/or across the electronic equipment 75 to heat the electronic equipment 75.

System control logic 79 can monitor the system environment including the temperature in the enclosure and/or the temperature of the electronic equipment 75 to control the disconnect switch 81 and the fan control switch 83. In particular, the disconnect switch 81 can be maintained in the closed position as long as the temperature in the enclosure and/or the temperature of the electronic equipment 75 is within an acceptable range for operation of the electronic equipment 75 and as long as the voltage at the node A (the voltage generated by the rectifier 71 and/or the battery 73) is above a prescribed threshold. Otherwise, the disconnect switch 81 can be opened to protect the electronic equipment 75. For example, the system control logic 79 may provide a first low temperature threshold such as 14° F., a first high temperature threshold such as 131° F., and a low voltage threshold such as 21V such that the disconnect switch 81 is opened if the temperature falls below the first low temperature threshold, if the temperature rises above the first high temperature threshold, or the voltage at node A falls below the low voltage threshold to thereby protect the electronic equipment 75.

The system control logic 79 can open and close fan control switch 83 to control the fan(s) 77. For example, the fan(s) 77 can blow ambient or air conditioned air to cool the enclosure and electronic equipment 75, or the fan(s) can blow heated air to heat the enclosure and electronic equipment 75. The system control logic 79 can close the fan control switch 83 to turn the fan(s) on to blow heated air and to heat the enclosure and electronic equipment when the temperature is below a second low temperature threshold (greater than the first low temperature threshold) to maintain a temperature above the first low temperature threshold. The system control logic 79 can close the fan control switch 83 to turn the fan(s) on to blow ambient or air conditioned air and to cool the enclosure and electronic equipment 75 when the temperature is above a second high temperature threshold (less than the first high temperature threshold) to maintain a temperature less than the first high temperature threshold. Accordingly, the system control logic 79 can operate fan control switch 83 and thus the fan(s) 77 as long as power is provided via the AC switch 85. While the system control logic 79 is shown as a single block, the functionality of the system control logic may be divided into separate blocks.

The AC switch 85 of FIG. 3 can alternately provide coupling between fan control switch 83 and node A when AC power is provided to the rectifier 71, or provide coupling between fan control switch 83 and node B when AC power is not being provided to the rectifier 71. When AC power is provided to the rectifier 71, the system control logic 79 and the fan(s) 77 can thus receive power whether the disconnect switch 81 is opened or closed. Accordingly, the fan(s) 77 may operate to control the temperature even when the electronic equipment 75 is turned off at disconnect switch 81 as long as AC power is being provided to the rectifier 21.

In the event that there is an interruption of AC power, the AC switch 85 can couple the fan control switch 83 to the node B so that power to the fan(s) 77 will be disconnected if the disconnect switch 81 is opened. Accordingly, power to the fan(s) 77 will be disconnected when the battery voltage drops below the low voltage threshold. Accordingly, the fan(s) 77 will not run the battery down to an excessively discharged state in the event that AC power is interrupted for a prolonged period of time and the temperature is above the second high temperature threshold or below the second low temperature threshold.

Figure 4:
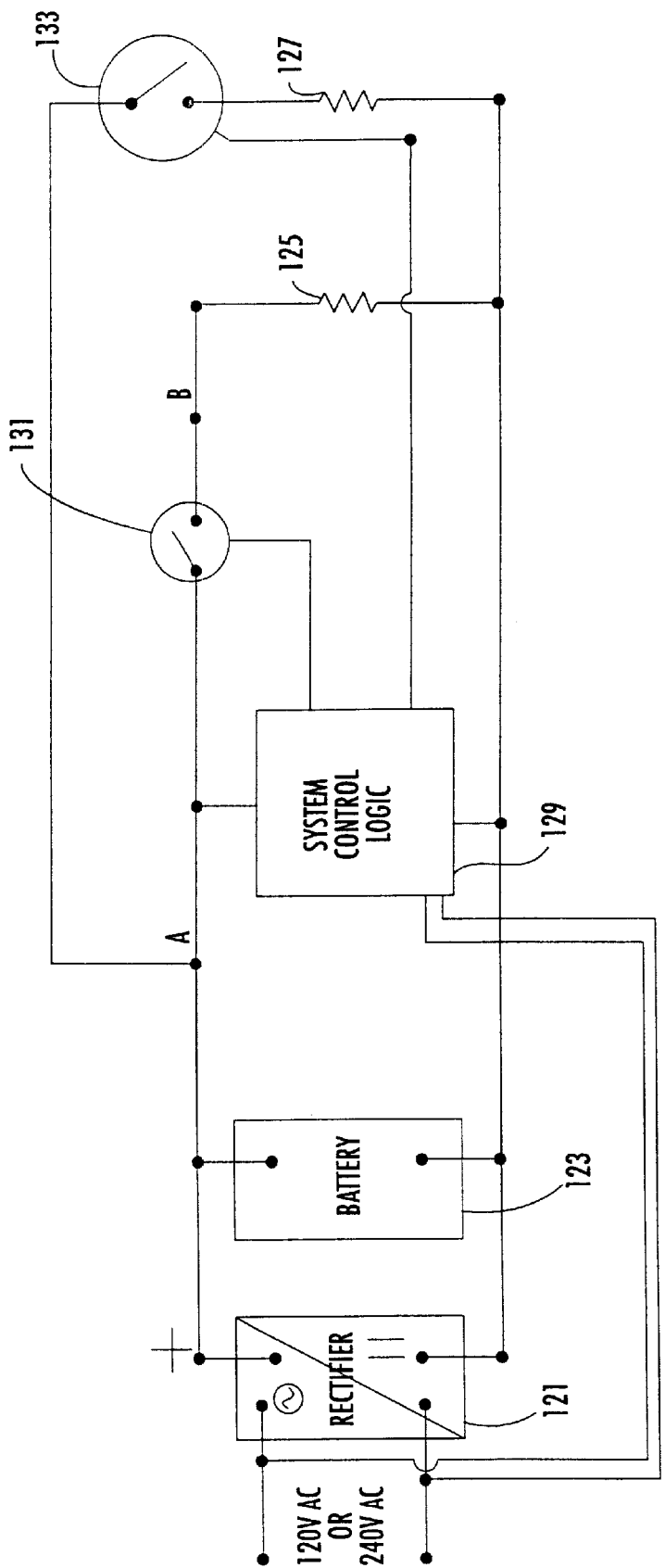
FIG. 4 is a third schematic diagram of systems and methods according to embodiments of the present invention.

FIG. 4 is a schematic diagram for a third electrical system housed in an enclosure according to embodiments of the present invention. This system is similar to the system of FIG. 3 with differences being the AC switch 85 and the fan control switch 83 of FIG. 3 are combined into a single fan control switch 133. The system of FIG. 3 may include a rectifier 121 that converts an AC power signal (such as a 120V AC or a 240V AC signal) to a DC power signal, and a battery 123 that can provide a DC power signal back-up in the event that the AC power signal is interrupted. The rectifier 121 and/or the battery 123 can be used to power the electronic equipment 125 that is modeled as a DC resistive load in FIG. 4. The electronic equipment 125 can be the radio base station equipment housed in an enclosure at a radio base station of a radiotelephone system operator. Alternatively, the electronic equipment 125 could be electronic equipment for any other electronic device or system.

The system of FIG. 4 can also include one or more temperature control fan(s) 127 (modeled as a second DC resistive load) used to heat and/or cool the electronic equipment 125. If the temperature of the electronic equipment 125 or the temperature within the enclosure enclosing the electronic equipment exceeds a high temperature threshold, the fan(s) 127 can blow air through the enclosure and/or across the electronic equipment 125 to cool the electronic equipment. If the temperature of the electronic equipment 125 and/or the temperature within the enclosure enclosing the electronic equipment 125 falls below a low temperature threshold, the fan(s) can blow heated air through the enclosure and/or across the electronic equipment 125 to heat the electronic equipment 125.

System control logic 129 can monitor the system environment including the temperature in the enclosure and/or the temperature of the electronic equipment 125 as well as the voltage at node A to control the disconnect switch 131, and the fan control switch 133. In particular, the disconnect switch 131 can be maintained in the closed position as long as the temperature in the enclosure and/or the temperature of the electronic equipment 75 is within an acceptable range for operation of the electronic equipment 125 and as long as the voltage at the node A (the voltage generated by the rectifier 121 and/or the battery 123) is above a prescribed threshold. Otherwise, the disconnect switch 131 can be opened to protect the electronic equipment 125. For example, the system control logic may provide a first low temperature threshold such as 14° F., a first high temperature threshold such as 131° F., and a low voltage threshold such as 21V such that the disconnect switch is opened if the temperature falls below the first low temperature threshold, if the temperature rises above the first high temperature threshold, or the voltage at node A falls below the low voltage threshold to thereby protect the electronic equipment 125.

The system control logic 129 can open and close fan control switch 133 to control the fan(s) 127. For example, the fan(s) 127 can blow ambient or air conditioned air to cool the enclosure and electronic equipment 125, or the fan(s) 127 can blow heated air to heat the enclosure and electronic equipment 125. The system control logic 129 can close the fan control switch 133 to turn the fan(s) on to blow heated air and to heat the enclosure and electronic equipment when the temperature is below a second low temperature threshold (greater than the first low temperature threshold) to maintain a temperature above the first low temperature threshold. The system control logic 129 can close the fan control switch 133 to turn the fan(s) on to blow ambient or air conditioned air and to cool the enclosure and electronic equipment 125 when the temperature is above a second high temperature threshold (less than the first high temperature threshold) to maintain a temperature less than the first high temperature threshold. In embodiments according to FIG. 4, a separate AC switch is removed from the system by providing appropriate control at the system control logic. In other words, the fan control switch 133 is coupled directly to node A and the fan control switch 133 can be closed to provide the operation noted in the table of FIG. 2. While the system control logic 129 is shown as a single block, the functionality of the system control logic may be divided into separate blocks.

In particular, the system control logic 129 can operate the fan control switch according to the second high and low temperature thresholds as long as AC power is provided to the rectifier 121. In the event that AC power is interrupted, the system control logic 129 can block closing of the fan control switch 133 if the battery voltage at node A drops below the low voltage threshold or if the temperature of the enclosure falls outside the first high and low temperature thresholds. This fan operation is consistent with the operations described above with respect to the table of FIG. 2. The system control logic 129 can operate the disconnect switch such that the electronic equipment 125 is disconnected from node A when the temperature is outside the range of the first high and low threshold temperatures or the voltage at node A is less than the low voltage threshold.

Figure 5:
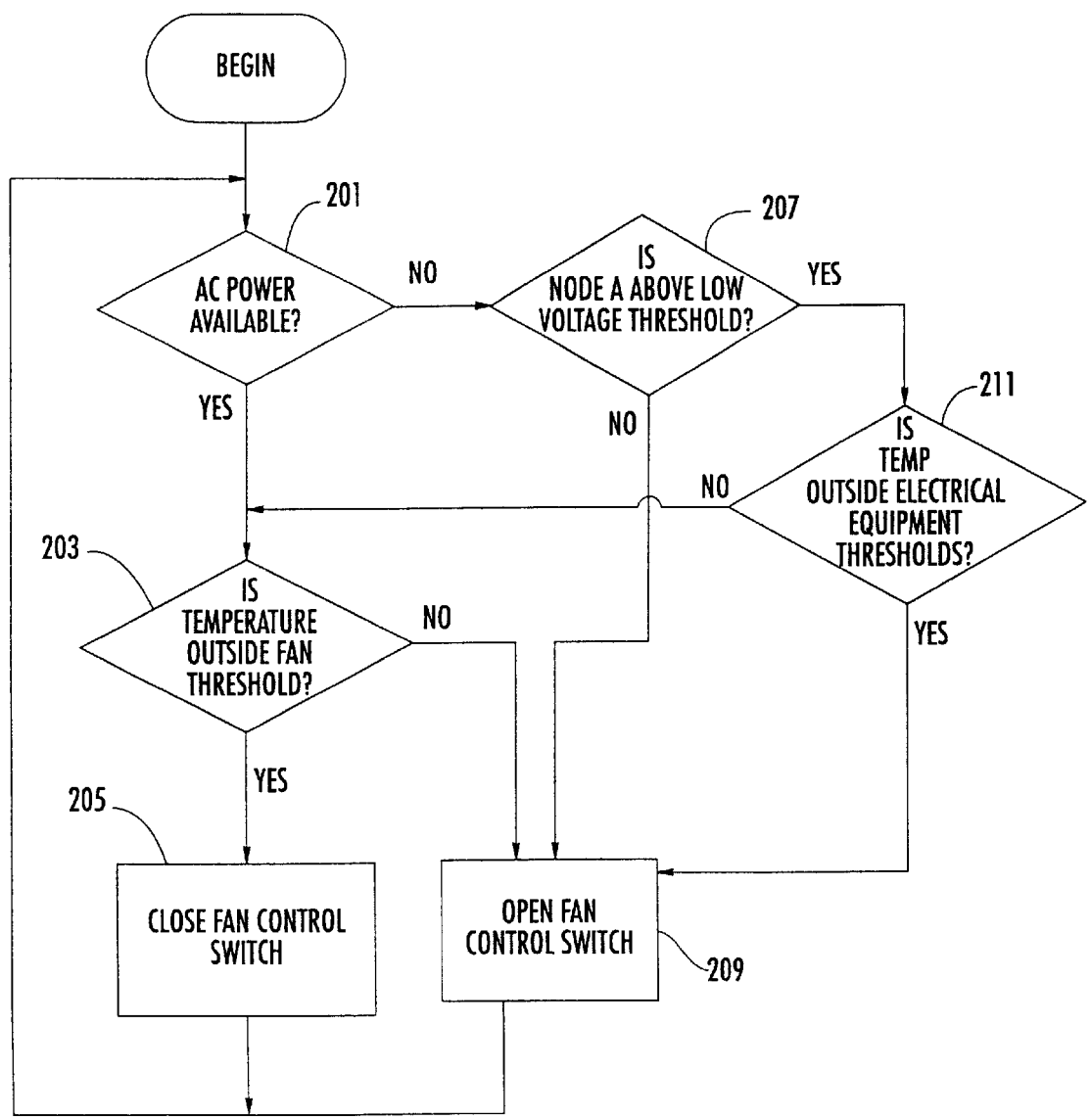
FIG. 5 is a flow chart illustrating fan control switch operations of systems and methods according to embodiments of the present invention.

FIG. 5 is a block diagram illustrating a first mode of operations for the fan control switch 133 and fan(s) 127 of FIG. 4. If AC power is available at block 201, and the temperature is outside the range of the second low and high temperature thresholds for operation of the fan(s) at block 203, the fan control switch 133 can be closed at block 205 to turn (or maintain) the fan(s) on. If the AC power is not available at block 201 and the voltage at node A is not above the low voltage at block 207, the fan control switch 133 is opened at block 209 to turn (or maintain) the fan(s) off. If AC power is not available at block 201, the voltage at node A is above the low voltage threshold at block 207, and the temperature in the enclosure is outside the range of the first high and low temperature thresholds for operation of the electronic equipment at block 211, the fan control switch is opened at block 209 to turn (or maintain) the fan(s) off. If AC power is not available at block 201, the voltage at node A is above the low voltage threshold at block 207, the temperature in the enclosure is within the range of the first high and low temperature thresholds for operation of the electronic equipment at block 211, and the temperature in the enclosure is outside the range of the second low and high temperature thresholds for operation of the fan(s) at block 203, the fan control switch is closed at block 205 to turn (or maintain) the fan(s) on.

Figure 6:
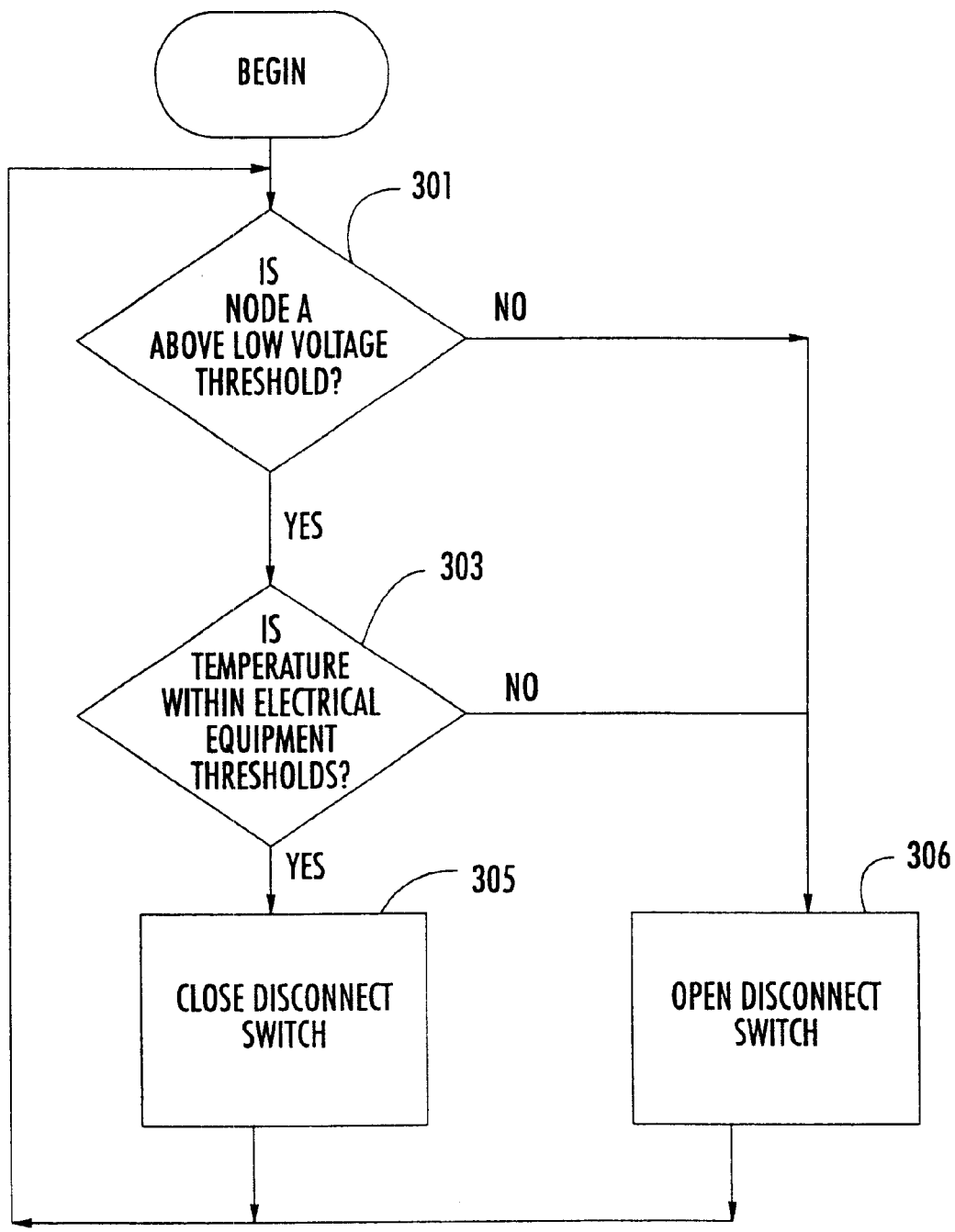
FIG. 6 is a flow chart illustrating disconnect switch operations of systems and methods according to embodiments of the present invention.

FIG. 6 is a block diagram illustrating a mode of operations for the disconnect switch 131 of FIG. 4. If the voltage at node A is above the low voltage threshold at block 301, and the temperature in the enclosure is within the range of the first low and high temperature thresholds for operation of the electronic equipment 125 at block 303, the disconnect switch 131 is closed at block 305 to allow operation of the electronic equipment. If the voltage at node A is not above the low voltage threshold at block 301, or the temperature in the enclosure is not within the range of the first low and high temperature thresholds for operation of the electronic equipment at block 303, the disconnect switch 131 is opened at block 306 to block operation of the electronic equipment. The operations of FIGS. 5 and 6 provide fan and electronic equipment operation consistent with that set forth in the table of FIG. 2.

Figure 7:
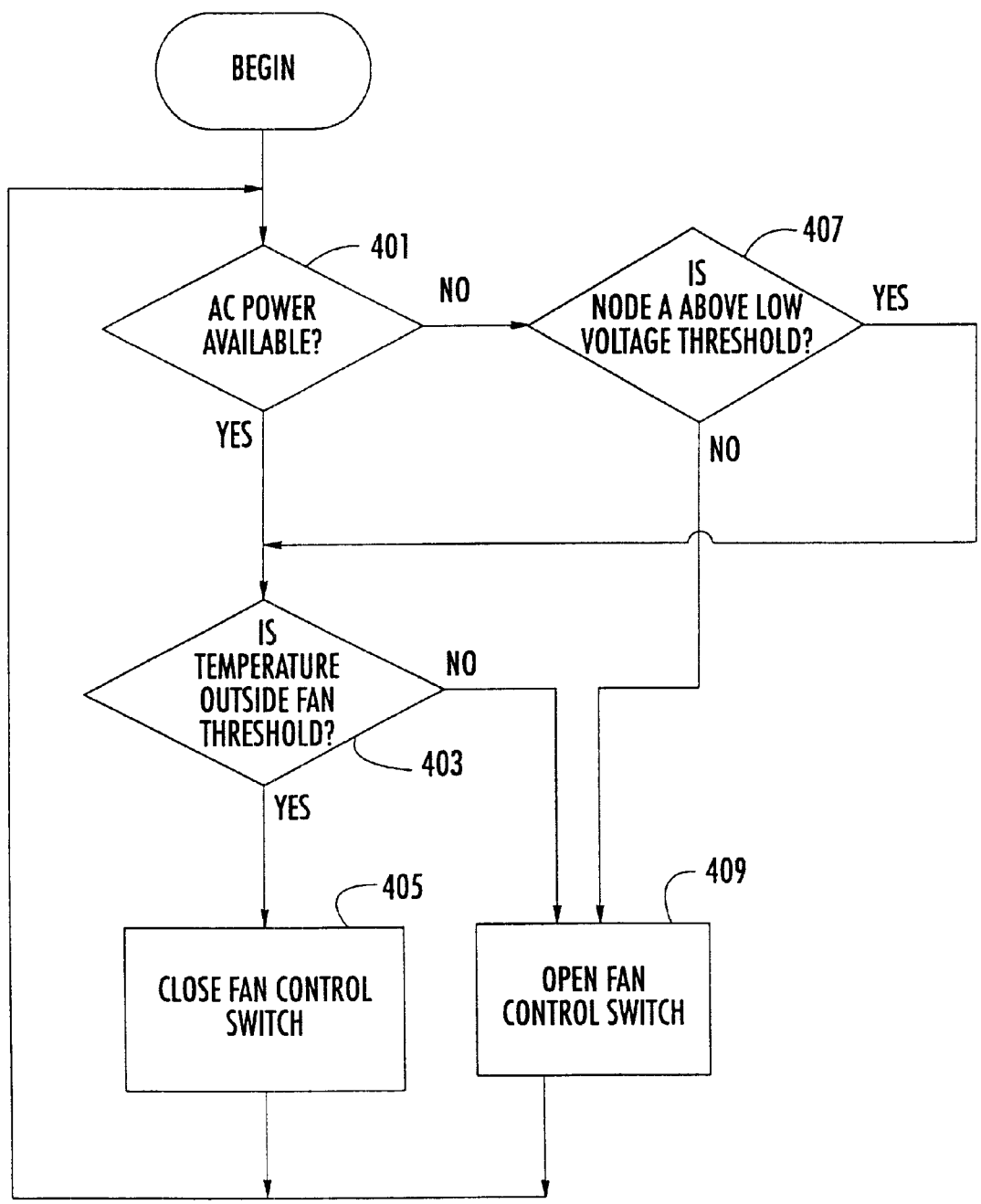
FIG. 7 is a flow chart illustrating second fan control switch operations of systems and methods according to embodiments of the present invention.

FIG. 7 is a block diagram illustrating alternate operations for the fan control switch 133 and fan(s) 127 of FIG. 4. If AC power is available at block 401, and the temperature is outside the range of the second low and high temperature thresholds for operation of the fan(s) at block 403, the fan control switch 133 can be closed at block 405 to turn (or maintain) the fan(s) on. If the AC power is not available at block 401 and the voltage at node A is not above the low voltage threshold at block 407, the fan control switch 133 is opened at block 409 to turn (or maintain) the fan(s) off. If AC power is not available at block 201, the voltage at node A is above the low voltage threshold at block 407, and the temperature in the enclosure is outside the range of the second low and high temperature thresholds for operation of the fan(s) at block 403, the fan control switch is closed at block 205 to turn (or maintain) the fan(s) on. In the example of FIG. 7, the fan(s) can be used for temperature control as long as the AC power is available at block 401 or node A is above the low voltage threshold at block 407. More particularly, the fan(s) can be used when the AC power is not available at block 401 and the voltage at node A is above the low voltage threshold even if the temperature in the enclosure is outside the range of the first low and high temperature thresholds for operation of the electronic equipment inside the enclosure. Moreover, operations according to FIG. 7 may not require the system control logic 129 to monitor the AC power signal at the input of rectifier 121.

The present invention may be embodied as methods or devices. In addition, the invention may take the form of an entirely hardware embodiment, an entirely software embodiment, or an embodiment combining both hardware and software aspects. The present invention has been described in part with respect to the block diagrams of FIGS. 1A and 3–4 and the flow charts of FIGS. 5–7. It will be understood that each block of the illustrations, and combinations of blocks, can be implemented by computer program instructions. These program instructions, which may represent steps, may be provided to a processor to produce a machine.

Accordingly, blocks of the block diagrams support combinations of means for performing the specified functions in combinations of steps for performing the specified functions. It will be understood that each block of the illustrations, and combinations of blocks, can be implemented by special purpose hardware-based systems which perform the specified functions or steps, or combinations of special purpose hardware and computer instructions.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of operating electronic equipment in an enclosure wherein the electronic equipment is powered by a DC power source including a rectifier that receives an AC power signal and a battery that provides backup when the AC power signal is interrupted, the method comprising:

monitoring a DC power signal generated by the DC power source;

monitoring a temperature in the enclosure for the electronic equipment;

blocking the DC power signal from the electronic equipment in the enclosure when the DC power signal is less than a low voltage threshold for the battery or when the temperature in the enclosure is outside a range of first high and low temperature thresholds for operation of the electronic equipment;

providing the DC power signal to the electronic equipment in the enclosure when the DC power signal is above the low voltage threshold for the battery and when the temperature in the enclosure is within the range of the first high and low temperature thresholds for operation of the electronic equipment;

operating a temperature control fan when the DC power signal is above the low voltage threshold and the temperature is outside a range of second high and low temperature thresholds for operation of the fan; and blocking operating of the temperature control fan when the DC power signal is less than the low voltage threshold for the battery or when the temperature is within the range of the second high and low temperature thresholds for operation of the fan.

2. The method of claim 1 wherein the first high temperature threshold for operation of the electronic equipment is greater than the second high temperature threshold for operation of the fan, and wherein the first low temperature threshold for operation of the electronic equipment is less than the second low temperature threshold for operation of the fan.

3. The method of claim 1 wherein the rectifier and battery are coupled in parallel.

4. The method of claim 1 further comprising blocking operating of the temperature control fan when the AC power signal is not available and when the temperature is outside the range of the first high and low temperature thresholds for operation of the electronic equipment.

5. The method of claim 1 further comprising blocking operating of the temperature control fan when each of the AC power signal is not available, the temperature is outside the range of the first high and low temperature thresholds for operation of the electronic equipment, and the DC power signal is above the low voltage threshold for the battery.

6. The method of claim 5 wherein the rectifier and battery are coupled in parallel to generate the DC Power signal at a node A, wherein a disconnect switch is coupled between the node A and a node B, wherein the electronic equipment is coupled with node B, wherein blocking the DC power signal from the electronic equipment comprises opening the disconnect switch, wherein providing the DC power signal to the electronic equipment comprises closing the disconnect switch, wherein fan power is coupled from node A when AC power is available, and wherein the DC power signal is coupled from node B when AC power is interrupted so that the DC power signal is blocked from the fan when each of the AC power is interrupted and the disconnect switch is opened.

7. A system supporting operation of electronic equipment in an enclosure wherein the electronic equipment is powered by a DC power source including a rectifier that receives an AC power signal and a battery that provides backup when the AC power signal is interrupted, the system comprising:
    control logic that monitors a DC power signal generated by the DC power source and a temperature in the enclosure for the electronic equipment, wherein the control logic generates control signals responsive to monitoring of the DC power signal and the temperature; and
    DC power signal switching responsive to the control logic wherein the DC power signal switching blocks the DC power signal from the electronic equipment in the enclosure when the DC power signal is less than a low voltage threshold for the battery or when the temperature in the enclosure is outside a range of first high and low temperature thresholds for operation of the electronic equipment, and that provides the DC power signal to the electronic equipment in the enclosure when the DC power signal is above the low voltage threshold for the battery and when the temperature in the enclosure is within the range of the first high and low temperature thresholds for operation of the electronic equipment, and wherein the DC power signal switching operates a temperature control fan when the DC power signal is above the low voltage threshold and the temperature is outside a range of second high and low temperature thresholds for operation of the fan, and wherein the DC power signal switching blocks operating of the temperature control fan when the DC power signal is less than the low voltage threshold for the battery or when the temperature is within the range of the second high and low temperature thresholds for operation of the fan.

8. The system of claim 7 wherein the first high temperature threshold for operation of the electronic equipment is greater than the second high temperature threshold for operation of the fan, and wherein the first low temperature threshold for operation of the electronic equipment is less than the second low temperature threshold for operation of the fan.

9. The system of claim 7 wherein the rectifier and battery are coupled in parallel.

10. The system of claim 7 wherein the DC power signal switching further blocks operating of the temperature control fan when the AC power signal is not available and when the temperature is outside the range of the first high and low temperature thresholds for operation of the electronic equipment.

11. The system of claim 7 wherein the DC power signal switching further blocks operating of the temperature control fan when each of the AC power signal is not available, the temperature is outside the range of the first high and low temperature thresholds for operation of the electronic equipment, and the DC power signal is above the low voltage threshold for the battery.

12. The system of claim 11 wherein the rectifier and battery are coupled in parallel to generate the DC Power signal at a node A, wherein the DC power signal switching comprises a disconnect switch coupled between the node A and a node B, wherein the electronic equipment is coupled with node B, wherein blocking the DC power signal from the electronic equipment comprises opening the disconnect switch, wherein providing the DC power signal to the electronic equipment comprises closing the disconnect switch, wherein fan power is coupled from node A when AC power is available, and wherein the DC power signal is coupled from node B when AC power is interrupted so that the DC power signal is blocked from the fan when each of the AC power is interrupted and the disconnect switch is opened.

13. An electrical system comprising:
    an enclosure providing protection from an outside environment;
    electronic equipment in the enclosure;
    a DC power source that generates a DC power signal, the DC power source including a rectifier that receives an AC power signal and a battery that provides backup when the AC power signal is interrupted;
    control logic that monitors a DC power signal generated by the DC power source and a temperature in the enclosure, wherein the control logic generates control signals responsive to monitoring of the DC power signal and the temperature; and
    DC power signal switching responsive to the control logic wherein the DC power signal switching blocks the DC power signal from the electronic equipment in the enclosure when the DC power signal is less than a low voltage threshold for the battery or when the temperature in the enclosure is outside a range of first high and low temperature thresholds for operation of the electronic equipment, and that provides the DC power signal to the electronic equipment in the enclosure when the DC power signal is above the low voltage threshold for the battery and when the temperature in the enclosure is within the range of the first high and low temperature thresholds for operation of the electronic equipment, and wherein the DC power signal switching operates a temperature control fan when the DC power signal is above the low voltage threshold and the temperature is outside a range of second high and low temperature thresholds for operation of the fan, and wherein the DC power signal switching blocks operating of the temperature control fan when the DC power signal is less than the low voltage threshold for the battery or when the temperature is within the range of the second high and low temperature thresholds for operation of the fan.

14. The electrical system of claim 13 wherein the first high temperature threshold for operation of the electronic equipment is greater than the second high temperature threshold for operation of the fan, and wherein the first low temperature threshold for operation of the electronic equipment is less than the second low temperature threshold for operation of the fan.

15. The electrical system of claim 13 wherein the rectifier and battery are coupled in parallel.

16. The electrical system of claim 13 wherein the DC power signal switching further blocks operating of the temperature control fan when the AC power signal is not available and when the temperature is outside the range of the first high and low temperature thresholds for operation of the electronic equipment.

17. The electrical system of claim 13 wherein the DC power signal switching further blocks operating of the temperature control fan when each of the AC power signal is not available, the temperature is outside the range of the first high and low temperature thresholds for operation of the electronic equipment, and the DC power signal is above the low voltage threshold for the battery.

18. The electrical system of claim 17 wherein the rectifier and battery are coupled in parallel to generate the DC Power signal at a node A, wherein the DC power signal switching comprises a disconnect switch coupled between the node A and a node B, wherein the electronic equipment is coupled with node B, wherein blocking the DC power signal from the electronic equipment comprises opening the disconnect switch, wherein providing the DC power signal to the electronic equipment comprises closing the disconnect switch, wherein fan power is coupled from node A when AC power is available, and wherein the DC power signal is coupled from node B when AC power is interrupted so that the DC power signal is blocked from the fan when each of the AC power is interrupted and the disconnect switch is opened.

19. A system supporting operation of electronic equipment and a fan in an enclosure wherein the electronic equipment is powered by a DC power source including a rectifier that receives an AC power signal and a battery that provides backup when the AC power signal is interrupted wherein the DC power source generates a DC power signal at a node A, the system comprising:

a disconnect switch coupled between the node A and a node B wherein the electronic equipment is coupled to the node B;

an AC switch that selectively couples the fan with one of node A when an AC power signal is received at the rectifier or node B when the AC power signal to the rectifier is interrupted so that the disconnect switch must be closed to provide fan operation when the AC power signal to the rectifier is interrupted; and control logic that monitors the DC power signal generated by the DC power source at node A and a temperature in the enclosure, wherein the control logic generates control signals responsive to monitoring of the DC power signal and the temperature to open the disconnect switch when either the temperature is outside a range of low and high temperature thresholds for operation of the electronic equipment or the DC power signal is less than a low voltage threshold for the battery.

20. A system according to claim 19 wherein the AC switch comprises a AC relay coupled with an AC power signal input of the rectifier such that the AC relay couples the fan with node A when the AC power signal is received at the input of the rectifier and such that the AC relay couples the fan with node B when the AC power signal is not received at the input of the rectifier.

21. A system according to claim 19 further comprising:

a temperature control coupled between the AC relay and the fan wherein the temperature control allows operation of the fan when both a temperature in the enclosure is within a range of second high and low temperature thresholds for operation of the fan and DC power is provided via the AC relay.

22. A system according to claim 21 wherein the temperature control comprises a temperature control switch coupled in series between the AC relay and the fan.

* * * * *